United States Patent [19]
Hasan et al.

[11] Patent Number: 5,604,330
[45] Date of Patent: Feb. 18, 1997

[54] STAGGERED LAND PAD PATTERN ON SUBSTRATE FOR TAB INTERCONNECTION

[75] Inventors: Altaf Hasan, Chandler; J. D. Wilson, Phoenix; Siva Natarajan, Gilbert, all of Ariz.

[73] Assignee: Intel Corporation, Santa Clara, Calif.

[21] Appl. No.: 366,250

[22] Filed: Dec. 29, 1994

[51] Int. Cl.$^6$ .............................. H01L 23/02; H01R 9/00
[52] U.S. Cl. ...................... 174/52.4; 361/772; 361/774; 361/777; 361/813; 257/668
[58] Field of Search .................... 174/52.1, 52.2, 174/52.3, 52.4; 257/666, 648, 734, 735, 782, 786, 668; 361/813, 772, 774, 777; 29/834, 847, 850, 853, 854

[56] References Cited

U.S. PATENT DOCUMENTS 4,843,191  6/1989  Thomas ............................ 174/88 R
4,979,289  12/1990  Dunaway et al. .................. 29/834
5,155,065  10/1992  Schweiss .......................... 437/209
5,253,415  10/1993  Dennis ............................. 29/827

Primary Examiner—Bot L. Ledynh
Attorney, Agent, or Firm—Blakely, Sokoloff, Taylor & Zafman

[57] ABSTRACT

A package for a semiconductor device. The device is packaged using tape-automated bonding (TAB) to bond an integrated circuit chip to a package substrate of any type. The land pads on the substrate are staggered such that they are arranged in two rows with adjacent pads alternating. In this way, the effective overall pitch of the land pads is smaller than that of each row.

30 Claims, 6 Drawing Sheets

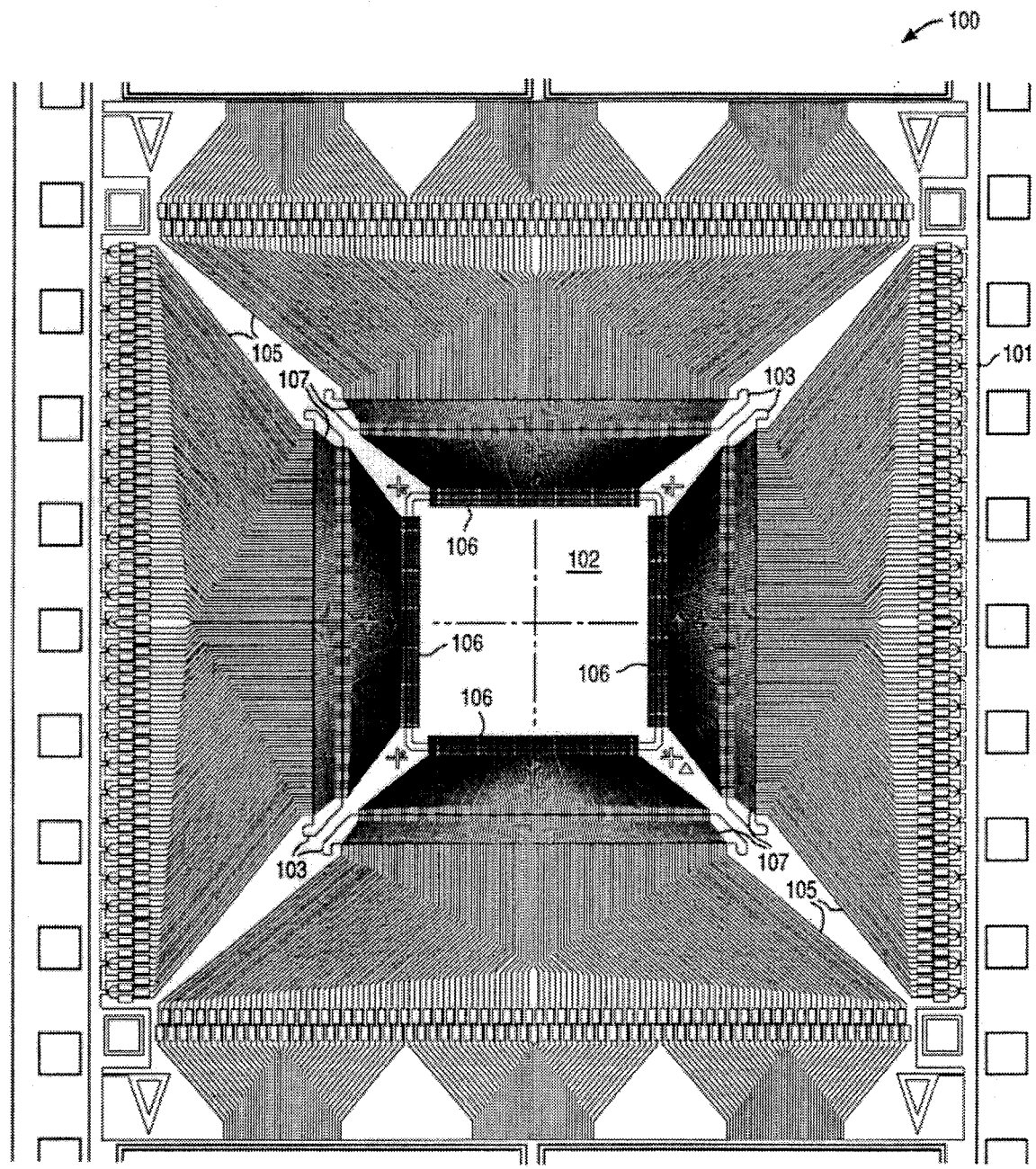
FIG_1

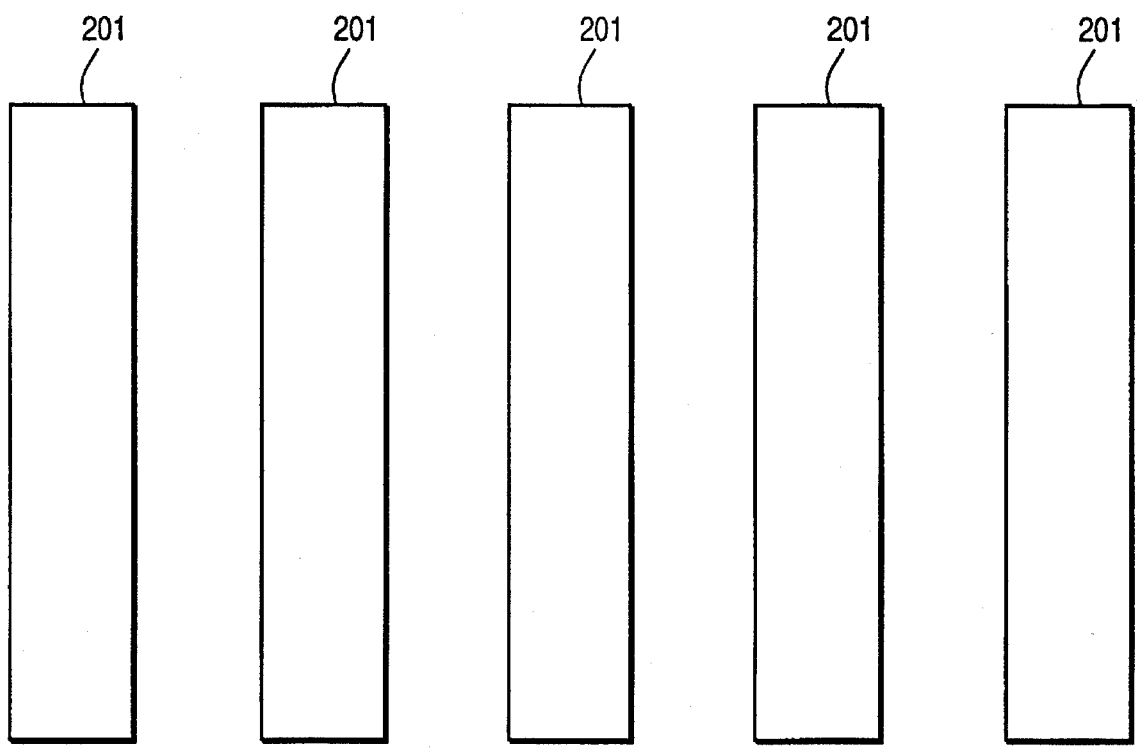
FIG_2 (PRIOR ART)

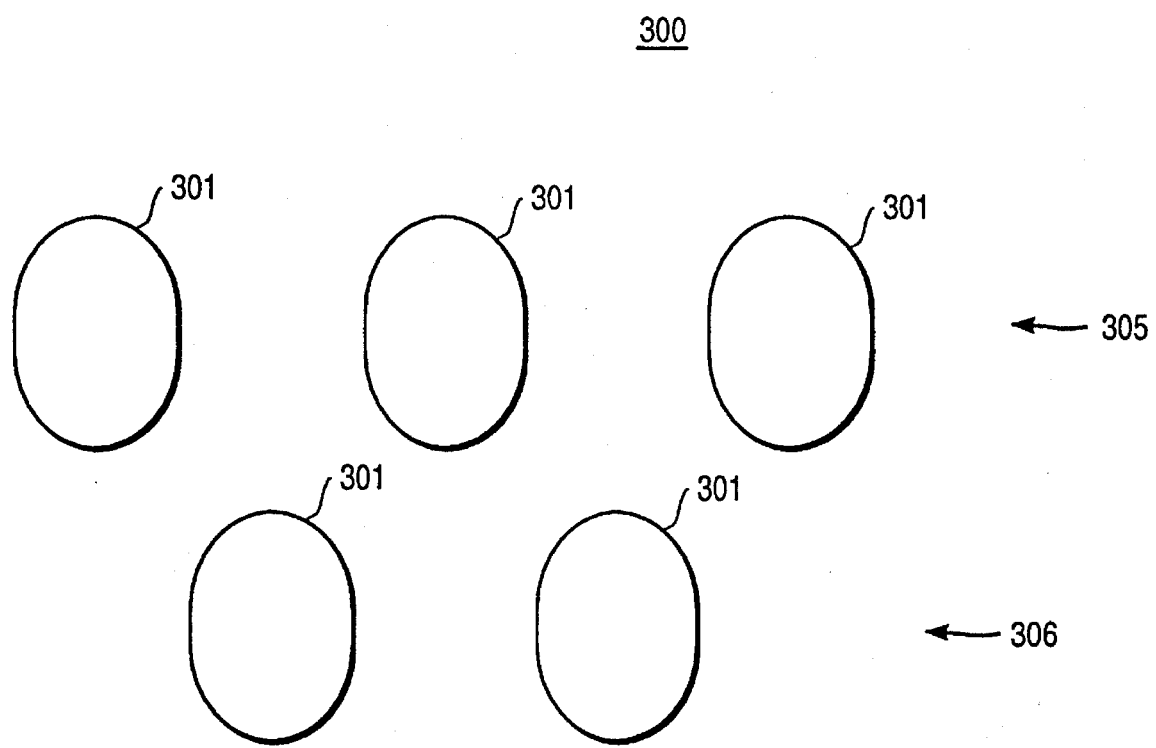
FIG_3

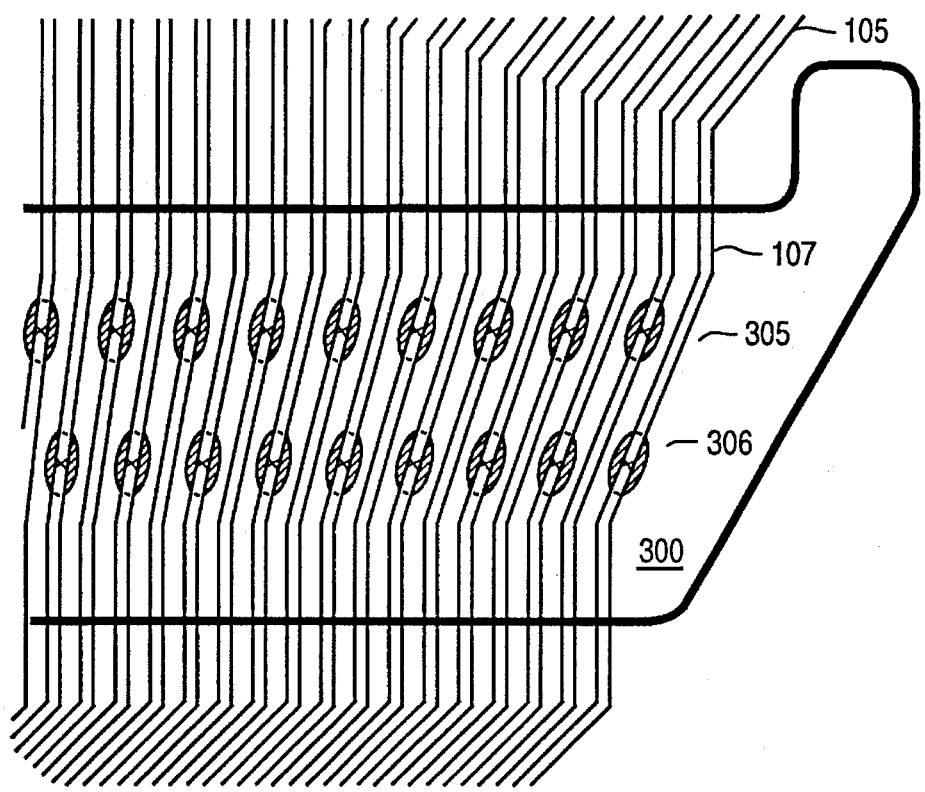
FIG_5
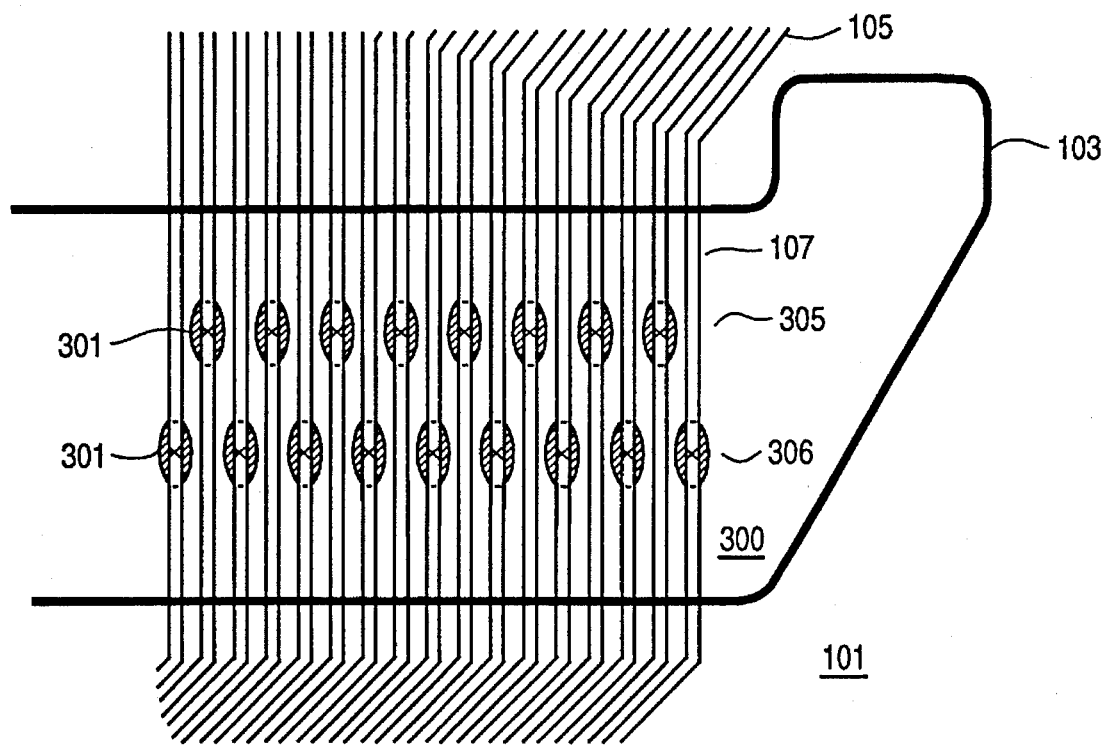
FIG_4

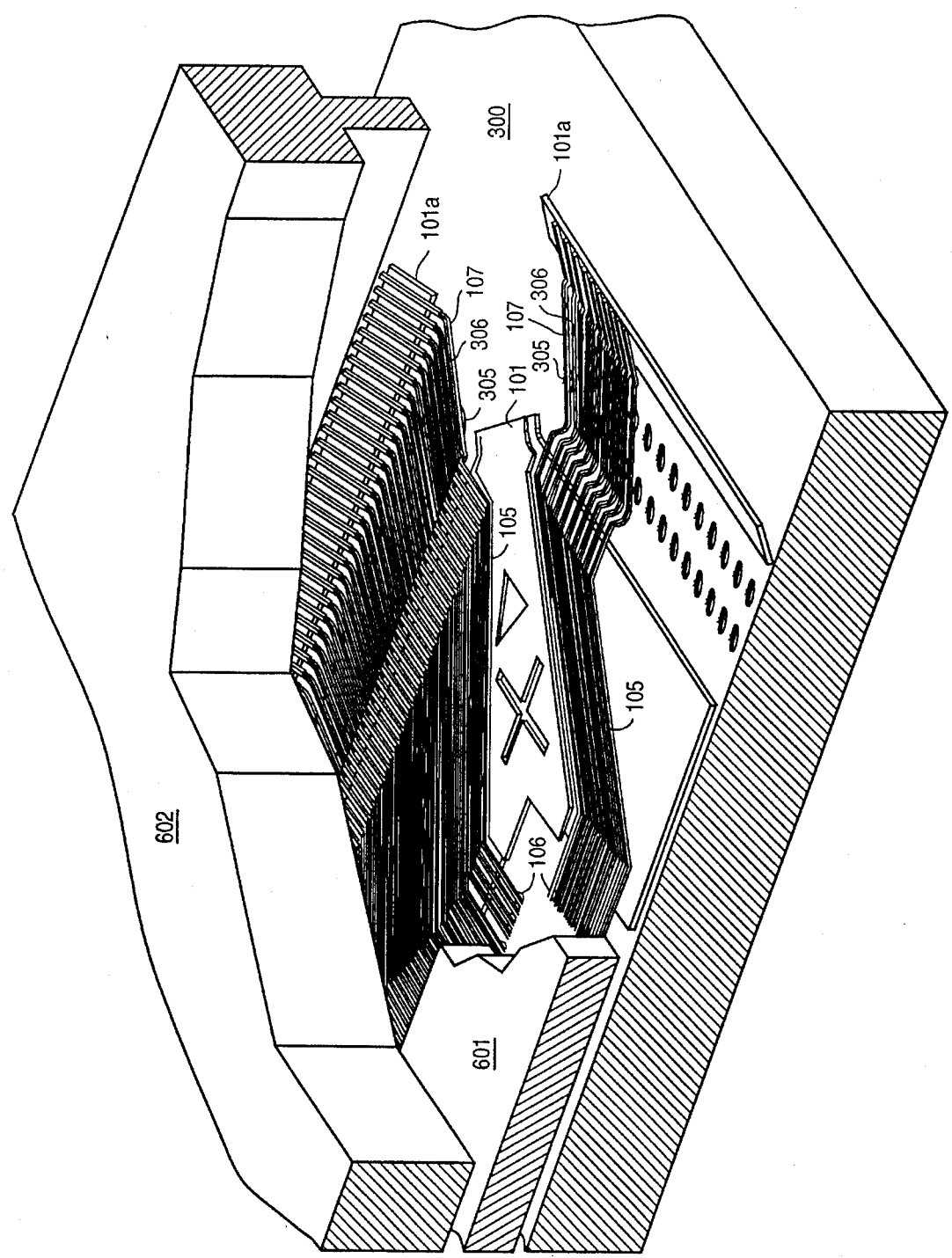
FIG_6

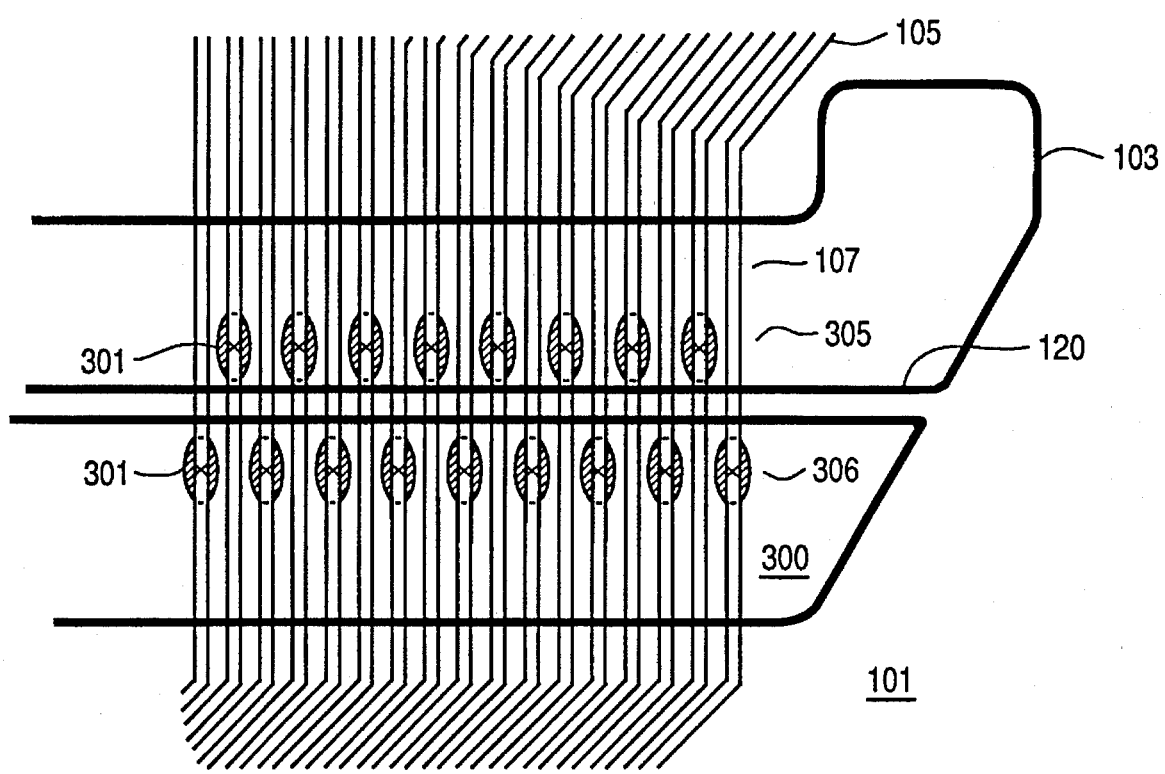
FIG_7

STAGGERED LAND PAD PATTERN ON SUBSTRATE FOR TAB INTERCONNECTION

BACKGROUND OF THE INVENTION

1. Field of the Invention

The present invention relates to a package for a semiconductor device, and more particularly to a method and apparatus for a fine pitch substrate to be used in a TAB interconnect package.

2. Background Information

Semiconductor devices such as integrated circuits may be packaged in various packages including, for example, plastic pin grid array (PPGA), plastic ball grid array (PBGA), ceramic pin grid array (CPGA), ceramic ball grid array (CBGA), and multi-chip modules (MCM). In these packages, tape automated bonding (TAB), or, a variant thereof known as flip-TAB, may be used to interconnect the integrated circuit chip with the package substrate. FIG. 1 shows an example of a TAB tape 100 used to couple an integrated circuit to a substrate. The TAB tape 100 shown in FIG. 1 is described in co-pending U.S. application Ser. No. 08/255,247, filed Jun. 6, 1994, which application is assigned to the assignee of the present invention. The TAB tape 100 comprises a tape 101 typically comprising polyimide. Additionally, the TAB tape 100 comprises sprockets and various alignment marks to aid in the manufacturing of the TAB tape 100 and in the packaging process.

The TAB tape 100 also comprises a plurality of conductive traces 105 which couple the integrated circuit to the substrate, in a manner to be described below. Each of the conductive traces 105 has a first end 106 extending into opening 102 of the TAB tape 100. This portion of the conductive trace 105 is known as the "inner lead" (IL), which is bonded to the chip in an inner lead bonding (ILB) process. As shown, the TAB tape 100 comprises numerous traces 105 terminating on each side of a generally rectangular shape for connection to a chip. Typically, there may be well over 100 traces 105 per side. It will be appreciated that a greater or lesser number of conductive traces 105 may be present on each side, and further, that, depending upon the device to be packaged, there may not be leads on all of the four sides but rather may, for example, be leads present on only two of the sides.

As shown, the TAB tape 100 comprises a plurality of openings or windows 103, which are called "outer lead bonding" (OLB) windows. The portion of conductive traces 105 extending across windows 103 comprise the land portions 107 of the traces 105 which will be bonded to a substrate such as those described above in an outer lead bonding process such as, for example, hot bar reflow, thermalsonic bonding, or ultrasonic bonding. Note that the pitch (distance between a point on a trace and the same point on the next trace) of the conductive traces 105 is typically smaller at the ends 106 than at the windows 103. This increase in pitch (and consequent increase in span across the traces 105) is known as inner lead-outer lead (IL-OL) fanout. This fanout is necessary to accommodate the outer lead bonding process manufacturing requirements. A problem with the fanout is that it increases the TAB footprint, thus requiring a larger package. The larger size increases the cost of the package, and is contrary to the trend of shrinking the overall package dimension of semiconductor devices.

FIG. 2 shows a portion of land pads 201 present on prior art package substrate 200. The land pads 201 are disposed on the substrate in a position corresponding to the land portions 107 of the conductive traces 105 within window 103. As mentioned above, each of the traces 105 is bonded to one of the land pads 201 by a variety of prior art methods. Typically, the pitch of the land pads 201 may be, for example, approximately 0.25 millimeters (mm). Also typically, the width of each land pad 201 and the space between each land pad 201 may be approximately equal, e.g., 0.125 mm. Of course, these dimensions may vary. As is well known, each of the pads 201 may be further coupled to, e.g. pins, by way of leads and vias on and within substrate 200 to allow for connection of the integrated circuit chip to other devices or systems.

As semiconductor device die sizes continue to shrink and/or more contact pads are added to the die, it becomes desirable to decrease the pitch of the land pads 201 on a substrate to keep the package smaller and less costly. For example, the pitch of the land pads on the various package substrates can be expected to be required to decrease to approximately 0.1 mm or less in the near future. However, such a fine pitch is not attainable with satisfactory yield and reliability on package substrates using conventional package substrate manufacturing technology. For example, package substrates may typically be manufactured using co-fired technology, wherein the pads and circuitry are attached to an uncured ceramic material, which is then fired and later cooled to create a hard ceramic substrate. Alternatively, the land pads and leads may be printed on a substrate by screening. While a finer pitch may be attainable using thin film substrate technology typical of semiconductor device fabrication, this technology is far more costly than the conventional package substrate manufacturing described above. Another approach is to use conventional package substrate manufacturing technology in a multi-shelf design. That is, the land pads are located on different levels of the package to increase the effective pitch. However, this approach is also costly.

Although the leads coupled to the land pads 201 on and within substrate 200 may be satisfactorily printed using conventional technology with a dimension of approximately 50 microns (0.05 mm) or so, it should be noted that some type of land pad larger than the lead width is necessary as it would be difficult to bond directly to these leads. That is, it is not practical to use land pads of this dimension, with a spacing approximately equal to this dimension, as the land portions 107 of traces 105 cannot reliably be bonded to such fine dimension land pads, without interlead shorting. Thus, while it is desirable to have minimum dimension land pads at a fine pitch to allow for smaller and lower cost packages, the OLB process may be more reliably carried out with larger land pads, spaced a sufficient distance apart.

What is needed is a method and apparatus to allow for fine pitch land pads using currently available low cost packaging technology and materials. It is desirable that the fine pitch land pads allow for interconnection to a fine pitch TAB part, with high reliability, without lead to lead shorting. It is further desired that the method and apparatus minimize or eliminate IL-OL fanout to allow for a smaller TAB footprint, thereby reducing package cost further.

SUMMARY OF THE INVENTION

A land pattern on a package substrate is disclosed. In one embodiment, a first land pad is staggered with respect to an adjacent land pad so that the effective pitch in each row is approximately twice the overall pitch of the pattern. In this way, high reliability bonding to a fine pitch, minimum footprint package may be accomplished.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which:

FIG. 1 illustrates a top view of a TAB tape that couples an integrated circuit chip to a substrate.

FIG. 2 illustrates the land pads on a prior art package substrate.

FIG. 3 illustrates staggered land pads in an embodiment of the present invention.

FIG. 4 illustrates bonding of TAB conductive traces to the land pads in an embodiment of the present invention in TAB tape utilizing straight leads.

FIG. 5 illustrates bonding of TAB conductive traces to the land pads in an embodiment of the present invention in TAB tape utilizing radial leads.

FIG. 6 illustrates a view of a packaged chip using an embodiment of the present invention.

FIG. 7 illustrates bonding of TAB conductive traces to land pads in an embodiment of the present invention with a portion of dielectric disposed on the TAB between two rows of land pads.

DETAILED DESCRIPTION

A staggered land pad pattern on substrate for TAB interconnection is disclosed. In the following description, numerous specific details are set forth such as specific materials, land pad patterns, TAB tapes, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

Referring to FIG. 3, a portion of a substrate 300 having land pads 301 is shown. As can be seen, the land pads 301 are arranged in two rows 305 and 306, staggered with respect to each other. In a preferred embodiment, the rows 305 and 306 have a space therebetween which is preferably kept to a minimum to minimize TAB footprint, but also is dictated by substrate manufacturability and the bonding process. In one embodiment, each of the land pads 301 in a row may have a dimension of, for example, 0.1 mm at the widest portion. Additionally, the spacing between each of the land pads 301 in a row may be in the range of, for example, approximately 0.1 mm. Note that each row therefore, such as row 305 and 306, has a pitch of approximately 0.2 mm using the exemplary dimensions above. Therefore, standard low cost package substrate manufacturing technologies can be used. Since the pitch in each row is within the capability of low cost manufacturing methods, the process is robust, resulting in high yields. However, since two rows are utilized, the total, overall effective pitch of land pads is approximately one half that of a single row.

This can best be seen in FIG. 4, which shows a portion of the outer lead bonding window 103. As described earlier, landing portions 107 of conductive traces 105 of TAB tape 100 extend across window 103. Also as shown, a first set of alternate ones of the land portions 107 are bonded to the land pads 301 in row 305, while a second set of alternate ones of the land portions 107 between the first set are bonded to the land pads 301 in row 306. Thus, as described above, the land portions 107 of conductive traces 105 in window 103 may be disposed at a smaller pitch, for example, 0.1 mm. Because the land portions 107 are placed at a small pitch, it is possible to minimize the inner lead-outer lead fanout. The amount of any fanout necessary will depend upon the spacing of the trace ends 106 disposed to couple to the integrated circuit. Thus, for example, if the ends 106 of FIG. 1 are disposed with a pitch of 0.1 mm, no fanout is necessary.

FIG. 5 shows an example of the present invention practiced on the radial leads in the outer lead bonding window 103. As can be seen, the advantage of reduced pitch of the present invention may be used in conjunction with the radial leads described in the earlier referenced patent application. That is, the bonding pads 301 of FIG. 5 are disposed at an angle so as to bond with radial land portions 107 of conductive traces 105. Thus, reduced pitch, in a device having reduced shrinkage error on the land joints and conductive traces may be achieved.

FIG. 6 shows a cutaway view of a packaged integrated circuit chip 601. As can be seen, the conductive traces 105 have been bonded along the land portions 107 to the land pads 301 in each of the rows 305 and 306 on all sides of the chip 601. As shown, a flip-TAB package, wherein the surface of the chip 601 having bonding pads is disposed downwards towards the substrate 300, is used to couple the inner ends 106 of the conductive traces 105 to the chip 601. As is well known, a portion of TAB tape 101a remains beyond the land portion 107 for manufacturing purposes.

It will be appreciated that although exemplary dimensions have been described, the present invention is not so limited. In general, the present invention can be used in any substrate manufacturing process to reduce by a factor of approximately two the pitch of the conductive traces achievable with that technology. Alternatively, the present invention may be used to increase the reliability of a process by allowing for approximately twice the spacing between adjacent land pads at a given pitch of conductive traces. Additionally, some combination of reduced pitch and increased reliability may be had. With the present invention, since the pitch of the conductive traces 105 may be made smaller, the overall footprint of the TAB bond is decreased, thus reducing package cost.

To improve bonding yield and reliability, a dielectric may be placed between each row of the land pads 301. Use of the dielectric disposed between each row of the land pads 301 helps prevent lead to lead shorting which may otherwise occur without the use of a dielectric due to smearing of land pad materials. Note that placement of the dielectric between the rows of land pads 301 is made simpler by the increased space between the pads 301 due to the staggered placement of the land pads 301. Alternatively, if desired, TAB tape 101 may comprise a portion between each of the rows of land pads 301. For example, referring to FIG. 7, a strip 120, which may comprise the same material as TAB tape 101 (e.g., polyimide) may extend across the outer lead bonding window 103 underneath part of the land portions 107 of conductive traces 105 between the rows 305 and 306. In this way, minimum clearance between the two rows 305 and 306 of land pads 301 may be maintained, and lead position integrity during the bonding process may be maintained, without risk of shorting between the traces or land pads of adjacent rows.

Although a specific embodiment has been described, it will be appreciated that many variations thereof are within the scope and spirit of the present invention. For example, although two rows of land pads have been shown, it will be appreciated that more than two rows can be used, with adjacent land pads staggered, or displaced a distance along a direction generally parallel to the direction of the TAB leads, by a sufficient amount for manufacturing tolerances. However, it will be appreciated that use of only two rows will result in smaller footprint of the TAB package compared with more than two rows. Furthermore, although staggering each row of land pads so that the two rows are spaced a distance apart (i.e., the bottom of the top row is spaced a distance from the top of the bottom row) results in the greatest decrease in pitch, it will be appreciated that some benefit will be obtained by staggering the rows to any extent along the direction of the conductive traces. That is, the upper portion of the landing pads 301 in row 306 may be disposed adjacent to the lower portion of the pads 301 in row 305. This is especially true with oval or similar shaped pads where the dimension at the upper and lower portions of the pad 301 is not as great as at the central portion. This latter embodiment may not minimize pitch to the same extent as the embodiments shown herein. However, this embodiment does provide displacement between alternate ones of the land pads 301, thereby improving process reliability, and also minimizes the vertical distance between the top of the land pads 301 in row 305, and the bottom of the land pads 301 in the row 306.

Although specific exemplary dimensions have been described, it will be appreciated that the present invention may be used to decrease the pitch by a factor of as much as approximately two of any given substrate manufacturing technology. Additionally, although land pads having a generally oval shape have been shown, it will appreciated that other shapes, for example rectangular, may be used in the practice of the present invention.

Thus, a staggered land pad pattern on substrate for tab interconnection has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A package for a semiconductor device comprising:

a tape having a plurality of leads, said leads having an inner lead portion and an outer lead portion, said outer lead portion having a radial land portion;

a substrate having a plurality of land pads, said land pads disposed to couple with said leads at said radial land portion of said leads, wherein a first one of the said land pads disposed to couple with a first one of said leads is staggered with respect to a second one of said land pads disposed to couple with a second one of said leads, said second one of said leads adjacent to said first one of said leads, wherein first ones of said land pads are disposed in a first row, and second ones of said land pads are disposed in a second row staggered from said first row, wherein said plurality of leads have a first pitch, wherein said land pads in said first row are disposed at a second pitch greater than said first pitch.

2. The package as described in claim 1 wherein first alternate ones of said land pads are disposed in a first row, and second alternate ones of said land pads between said first alternate ones are disposed in a second row staggered from said first row.

3. The package as described in claim 1 wherein a top of said first one of said land pads is displaced a distance from a bottom of said second one of said land pads.

4. The package as described in claim 2 wherein a top of said first alternate ones of said land pads are displaced a distance from a bottom of said second alternate ones of said land pads.

5. The package as described in claim 1 wherein said second pitch is approximately twice that of said first pitch.

6. The package as described in claim 4 wherein said second pitch is approximately twice that of said first pitch.

7. The package as described in claim 1 wherein said first pitch is approximately 0.1 mm or less.

8. The package as described in claim 4 wherein said first pitch is approximately 0.1 mm or less.

9. The package as described in claim 5 wherein said first pitch is approximately 0.1 mm or less.

10. The package as described in claim 6 wherein said first pitch is approximately 0.1 mm or less.

11. The package as described in claim 1 wherein a second portion of said plurality of leads is disposed to couple with a semiconductor device, said second portion of said plurality of leads disposed at a third pitch, wherein said third pitch is approximately equal to said first pitch.

12. The package as described in claim 4 wherein a second portion of said plurality of leads is disposed to couple with a semiconductor device, said second portion of said plurality of leads disposed at a third pitch, wherein said third pitch is approximately equal to said first pitch.

13. The package as described in claim 5 wherein a second portion of said plurality of leads is disposed to couple with a semiconductor device, said second portion of said plurality of leads disposed at a third pitch, wherein said third pitch is approximately equal to said first pitch.

14. The package as described in claim 6 wherein a second portion of said plurality of leads is disposed to couple with a semiconductor device, said second portion of said plurality of leads disposed at a third pitch, wherein said third pitch is approximately equal to said first pitch.

15. A package for a semiconductor device comprising:

a tape having a plurality of leads;

a substrate having a plurality of land pads, said land pads disposed to couple with said leads at a first portion of said leads, wherein a first one of the said land pads disposed to couple with a first one of said leads is staggered with respect to a second one of said land pads disposed to couple with a second one of said leads, said second one of said leads adjacent to said first one of said leads, wherein first ones of said land pads are disposed in a first row, and second ones of said land pads are disposed in a second row staggered from said first row, wherein said plurality of leads have a first pitch, wherein said land pads in said first row are disposed at a second pitch greater than said first pitch; and an electrically non-conductive material disposed between a top of said first one of said land pads and a bottom of said second one of said land pads.

16. The package as described in claim 15 wherein said material comprises of dielectric.

17. The package as described in claim 15 wherein said material comprises a same material as TAB tape.

18. The package as described in claim 17 wherein said TAB tape material comprises polyimide.

19. The package as described in claim 15 wherein first alternate ones of said land pads are disposed in a first row, and second alternate ones of said land pads between said first alternate ones are disposed in a second row staggered from said first row.

20. The package as described in claim 16 wherein a top of said first alternate ones of said land pads are displaced a distance from a bottom of said second alternate ones of said land pads.

21. The package as described in claim 15 wherein said second pitch is approximately twice that of said first pitch.

22. The package as described in claim 20 wherein said second pitch is approximately twice that of said first pitch.

23. The package as described in claim 15 wherein said first pitch is approximately 0.1 mm or less.

24. The package as described in claim 20 wherein said first pitch is approximately 0.1 mm or less.

25. The package as described in claim 21 wherein said first pitch is approximately 0.1 mm or less.

26. The package as described in claim 22 wherein said first pitch is approximately 0.1 mm or less.

27. The package as described in claim 15 wherein a second portion of said plurality of leads is disposed to couple with a semiconductor device, said second portion of said plurality of leads disposed at a third pitch, wherein said third pitch is approximately equal to said first pitch.

28. The package as described in claim 20 wherein a second portion of said plurality of leads is disposed to couple with a semiconductor device, said second portion of said plurality of leads disposed at a third pitch, wherein said third pitch is approximately equal to said first pitch.

29. The package as described in claim 21 wherein a second portion of said plurality of leads is disposed to couple with a semiconductor device, said second portion of said plurality of leads disposed at a third pitch, wherein said third pitch is approximately equal to said first pitch.

30. The package as described in claim 22 wherein a second portion of said plurality of leads is disposed to couple with a semiconductor device, said second portion of said plurality of leads disposed at a third pitch, wherein said third pitch is approximately equal to said first pitch.

* * * * *